(12) United States Patent
Lim

(10) Patent No.: US 11,119,853 B2
(45) Date of Patent: Sep. 14, 2021

(54) PREDICTED ERROR CORRECTION APPARATUS, OPERATION METHOD THEREOF AND MEMORY SYSTEM USING THE SAME

(71) Applicant: SK hynix Inc., Gyeonggi-do (KR)

(72) Inventor: Su Jin Lim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 233 days.

(21) Appl. No.: 16/384,193

(22) Filed: Apr. 15, 2019

(65) Prior Publication Data

US 2020/0042383 A1 Feb. 6, 2020

(30) Foreign Application Priority Data

Aug. 6, 2018 (KR) .................. 10-2018-0091148

(51) Int. Cl.
*G06F 11/10* (2006.01)
*G11C 29/52* (2006.01)
*G06F 11/07* (2006.01)

(52) U.S. Cl.
CPC ........ *G06F 11/1068* (2013.01); *G06F 11/079* (2013.01); *G06F 11/0727* (2013.01); *G06F 11/0751* (2013.01); *G11C 29/52* (2013.01)

(58) Field of Classification Search
CPC .. G06F 11/10; G06F 11/0727; G06F 11/0751; G06F 11/079
See application file for complete search history.

(56) References Cited

U.S. PATENT DOCUMENTS

| | | | | |
|---|---|---|---|---|
| 7,496,796 B2* | 2/2009 | Kubo | .................... | G06F 11/008 714/42 |
| 7,774,651 B2* | 8/2010 | Mukherjee | .......... | G06F 11/0775 714/26 |
| 8,650,463 B2* | 2/2014 | Lim | ........................ | G06F 11/10 714/773 |
| 8,694,855 B1* | 4/2014 | Micheloni | ........... | G06F 11/1048 714/763 |
| 2008/0104453 A1* | 5/2008 | Mukherjee | ............ | G06F 11/079 714/47.3 |
| 2011/0191649 A1* | 8/2011 | Lim | ........................ | G06F 11/10 714/752 |
| 2011/0307679 A1* | 12/2011 | Roberts | ............... | G06F 12/0246 711/170 |

(Continued)

FOREIGN PATENT DOCUMENTS

KR 101623119 5/2016

*Primary Examiner* — Kamini B Patel
(74) *Attorney, Agent, or Firm* — IP & T Group LLP

(57) ABSTRACT

A memory system may include: a memory device configured to perform one or more of data write, read and erase operations; and a controller configured to execute an error management command and control the operation of the memory device, wherein the error management command is configured to determine first data which is highly likely to cause a read fail, among data stored in the memory device, determine one or more second data which is used to generate predicted error parity, and generate the predicted error parity based on the determined first and second data, and wherein the memory device performs the write operation to store indexes of the first and second data and the predicted error parity, under control of the controller.

16 Claims, 5 Drawing Sheets

(56) References Cited

U.S. PATENT DOCUMENTS

| | | | |
|---|---|---|---|
| 2015/0012795 A1* | 1/2015 | Sakaue | H03M 13/6502 714/758 |
| 2017/0171176 A1* | 6/2017 | Angaluri | G06F 11/0751 |
| 2019/0103169 A1* | 4/2019 | Bang | G11C 11/5671 |

* cited by examiner

PREDICTED ERROR CORRECTION APPARATUS, OPERATION METHOD THEREOF AND MEMORY SYSTEM USING THE SAME

CROSS-REFERENCE TO RELATED APPLICATION

The present application claims priority under 35 U.S.C. § 119(a) to Korean application number 10-2018-0091148, filed on Aug. 6, 2018, in the Korean Intellectual Property Office, which is incorporated herein by reference in its entirety.

BACKGROUND

1. Technical Field

Various embodiments generally relate to a predicted error correction apparatus, an operation method thereof and a memory system using the same, and more particularly, to a technique for correcting an error which occurs during a read operation for data stored in a memory system.

2. Related Art

In general, a memory device may be a volatile memory which loses data stored therein when power is cut off or a nonvolatile memory which retains data stored therein even when power is cut off. A data processing system including such a memory device requires a controller for controlling the memory device according to a request such as a write, read or erase request from an external host device. Furthermore, the controller may correct an error which may occur during a process of reading stored data from the memory device. However, such error correction ability of the controller may be limited because the error correction ability has a trade-off relationship with the performance of the data processing system.

SUMMARY

Various embodiments are directed to an error correction technique for improving the reliability of data and the efficiency of error correction.

In an embodiment, a memory system may include: a memory device configured to perform one or more of data write, read and erase operations; and a controller configured to execute an error management command and control the operation of the memory device, wherein the error management command is configured to determine first data which is highly likely to cause a read fail, among data stored in the memory device, determine one or more second data which is used to generate predicted error parity, and generate the predicted error parity based on the determined first and second data, and wherein the memory device performs the write operation to store indexes of the first and second data and the predicted error parity, under control of the controller.

In an embodiment, there is provided an operation method of a memory system which includes a memory device configured to store data and a controller configured to control the operation of the memory device. The operation method may include the steps of: determining, by the controller, first data which is highly likely to cause a read fail, among the data stored in the memory device; determining, by the controller, one or more second data which are used to generate predicted error parity as parity corresponding to the first data; generating, by the controller, the predicted error parity based on the first and second data; and performing, by the memory device, a write operation to store indexes of the first and second data and the predicted error parity, under control of the controller.

In an embodiment, a predicted error correction apparatus may include: a first data decision component configured to determine first data which is highly likely to cause a read fail, among data stored in a memory device; a second decision component configured to determine one or more second data which are used to generate predicted error parity as parity corresponding to the first data; and a predicted error parity generator configured to generate the predicted error parity based on the first and second data.

In an embodiment, a memory system comprising: a memory device suitable for storing a plurality of data; and a controller suitable for: determining first data and second data, the first data including data of which the number of fail bits is greater than a threshold value, the second data including at least one data among the plurality of data excluding the first data; generating parity data based on the first data and the second data; controlling the memory device to perform a read operation; and when it is determined that an error occurred on the first data as the result of the read operation, correcting the first data based on the parity data.

The first data may be determined based on one or more of a fail bit and whether soft decision has been performed.

The second data may be determined based on one or more of stability and locality of data.

The second data may be decided according to stability which is determined based on one or more of an erase number, whether soft decision has been performed, and a fail bit.

The second data may be determined based on one or more of temporary locality and spatial locality for the first data.

A fail bit which occurred in any one of the first and second data during a read operation may be corrected based on the predicted error parity.

The data containing the fail bit may be corrected based on the predicted error parity when the data is not corrected through an ECC decoding process.

All or part of the second data may be determined among the data stored in the memory device.

The number of second data may be determined based on the size of data constituting a data group.

All or part of the second data may be determined in a data group including the first data.

DETAILED DESCRIPTION

The present disclosure includes specific embodiments; however, they may be modified in various ways. Thus, the present disclosure is not limited to the specific embodiments described and illustrated herein, but may include all modifications, equivalents and substitutions that do not depart from the sprit and scope of the present disclosure. Moreover, detailed description of well-known functions and configurations is omitted in order not to unnecessarily obscure subject matter of the present disclosure. Furthermore, singular forms used in this specification and claims should be interpreted as including "one or more" components unless referred to the contrary.

Various embodiments will be described in detail with reference to the accompanying drawings. When the embodiments are described with reference to the accompanying drawings, the same or corresponding components are denoted by like reference numbers. Also, throughout the specification, reference to "an embodiment," "another embodiment" or the like is not necessarily to only one embodiment, and different references to any such phrase are not necessarily to the same embodiment(s).

Figure 1:
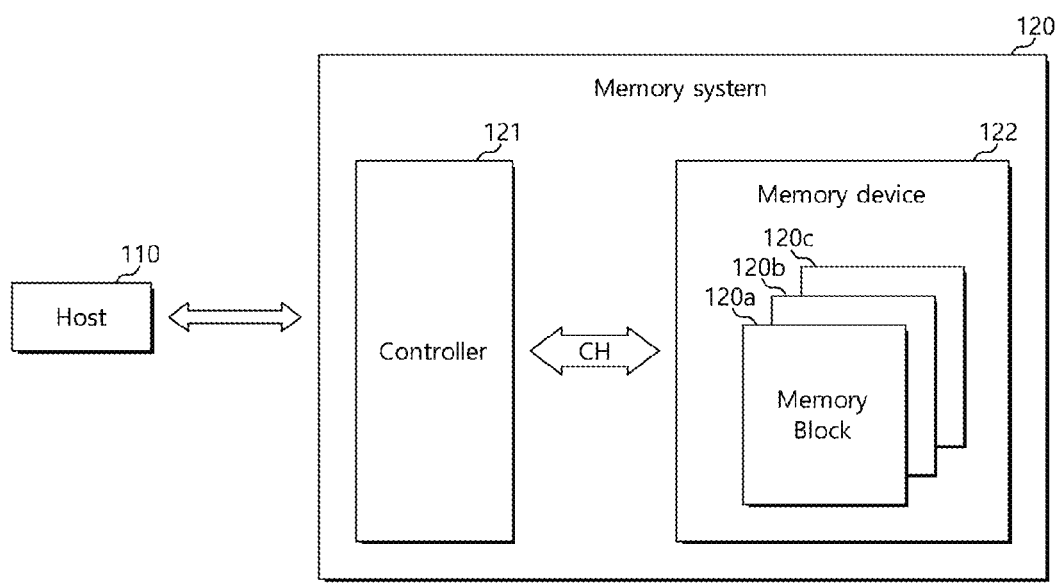
FIG. 1 is a diagram illustrating a data processing system in accordance with an embodiment.

FIG. 1 is a diagram illustrating a data processing system 100 in accordance with an embodiment.

Referring to FIG. 1, the data processing system 100 may include a host 110 and a memory system 120.

The host 110 may request the memory system 120 to perform overall operations for processing data, and receive the result from the memory system 120. The processing of the data may include writing, reading and erasing data.

Examples of the host 110 may include wired and/or wireless electronic devices such as a portable electronic device (for example, a mobile phone, MP3 player, laptop computer or the like), desktop computer, game machine, television (TV), projector and the like. The host 110 may include one or more operating systems (OS) such as Windows, Chrome and Linux, in order to provide a function and operation corresponding to the purpose of a user who uses the data processing system and the usage of the data processing system. Since the above-described configuration is only an example of the host 110 for facilitating understanding of the data processing system, the host 110 is not limited to the configuration.

The memory system 120 may perform an operation corresponding to a request of the host 110 and other overall operations required for maintaining the memory system 120. For this operation, the memory system 120 may include a controller 121 for controlling overall operations of the memory system 120 and a memory device 122. The memory device 122 may perform an operation based on a control command of the controller 121 and other overall operations required for maintaining the memory system 120. The controller 121 and the memory device 122 may be coupled through a channel CH. The controller 121 and the memory device 122 will be described below in detail with reference to FIGS. 2 to 9.

The memory system 120 may predict an error which may occur during an operation of reading data stored in the memory device 122, and correct the predicted error based on predicted error parity, when the predicted error occurs. Specifically, the memory system 120 may monitor a read operation, and determine or identify data which is highly likely to cause a read fail (first data), based on the monitoring result. The memory system 120 may determine or identify data used for generating predicted error parity corresponding to the first data (second data). When the first and second data are determined, the memory system 120 may generate and manage the predicted error parity based on the determined first and second data. Then, the memory system 120 may correct an error of the first data based on the predicted error parity, when the error, i.e. the predicted error, occurs during a read operation for the first data.

The memory system 120 may be configured as a personal computer memory card international association (PCMCIA) card, compact flash (CF) card, smart media card, memory stick, various multimedia cards (e.g., MMC, eMMC, RS-MMC and MMC-micro), secure digital (SD) card (e.g., SD, Mini-SD or Micro-SD), universal flash storage (UFS), solid state drive (SSD) or the like.

Since the above-described configuration is only an example of the memory system 120, the memory system 120 is not limited to the configuration.

Figure 2:
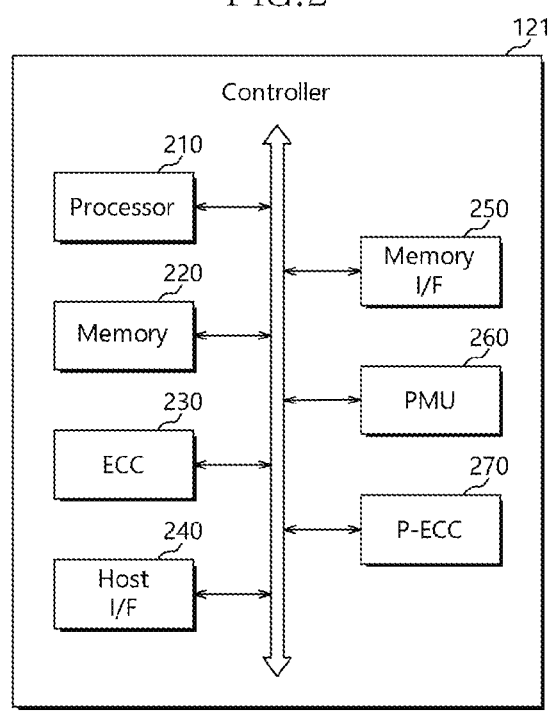
FIG. 2 is a block diagram illustrating a controller in accordance with the present embodiment.

FIG. 2 is a block diagram illustrating a controller 121 in accordance with the present embodiment.

Referring to FIG. 2, the controller 121 may include a processor 210, a memory 220, an error correction code (ECC) component 230, a host interface (I/F) 240, a memory I/F 250, a power manager (PMU) 260 and a predicted error correction (P-ECC) apparatus 270.

The processor 210 may control overall operations of the memory system 120. Specifically, when a request such as a write, read or erase request is received from the host 110, the processor 210 may control the components of the controller 121 and the operation of the memory device 122 or the like, in order to perform an operation corresponding to the received request.

In an embodiment, the processor 210 may execute firmware referred to as a flash translation layer (FTL) in order to control overall operations of the memory system 120. The FTL may be loaded to the memory 220, and the processor 210 may execute the loaded FTL.

In an embodiment, the FTL may include an error management command which is configured to predict an error which may occur during an operation of reading data stored in the memory device 122, and correct the predicted error based on predicted error parity, when the predicted error occurs. Specifically, the error management command may be configured to monitor a read operation, and determine data which is highly likely to cause a read fail (first data), based on the monitoring result. The error management command may be configured to determine data used for generating predicted error parity corresponding to the first data (second data). The error management command may be configured to generate and manage the predicted error parity based on the determined first and second data, when such data are determined. Then, the error management command may correct an error of the first data based on the predicted error parity, when the error, i.e. the predicted error, occurs during a read operation for the first data.

In an embodiment, the processor 210 may be implemented with a microprocessor or central processing unit (CPU).

The memory 220 may serve as a working memory of the controller 121 and the memory device 122. The memory 220 may store data such as firmware required for driving the controller 121 and the memory device 122. That is, the memory 220 may serve as a working memory for storing data required for driving the memory system 120, and the controller 121. Specifically, the memory 220 may store data received from the memory device 122 into the host 110, in order to perform an operation requested by the host 110, such as a write, read or erase operation. For this operation, the memory 220 may include a program memory, data memory, write buffer (or cache), read buffer (or cache), data buffer (or cache), or map buffer (or cache).

In an embodiment, the memory 220 may be configured as a volatile memory. For example, the memory 220 may implemented as a static random access memory (SRAM) or dynamic random access memory (DRAM).

The ECC 230 may correct an error of data processed by the memory system 120.

In an embodiment, the ECC 230 may include an ECC encoder and an ECC decoder (not illustrated). The ECC encoder may perform error correction encoding on data to be stored in the memory device 122 during a write operation. The ECC decoder may perform error correction decoding on data received from the memory device 122 during a read operation. The ECC encoder may generate a parity bit by performing error correction encoding on data to be stored in the memory device 122, and add the generated parity bit to the data to be stored in the memory device 122. The memory device 122 may store the data to which the parity bit is added. The ECC decoder may detect an error by performing error correction decoding on data received from the memory device 122 based on the parity bit, and correct the detected error. When the number of error bits contained in the detected error exceeds the limit of the error correction ability of the ECC decoder, the ECC decoder cannot correct the detected to error, and thus may output an error correction fail signal.

In an embodiment, the ECC 230 may perform hard decision and soft decision on data received from the memory device 122. The hard decision may indicate a method for correcting an error of the data received from the memory device 122, using only error correction codes and data which are read according to the on and off (on/off) characteristics of a memory cell when a set reference read voltage is applied (hard decision data). The soft decision may indicate a method for correcting an error of the data received from the memory device 122, using additional information on the reliability of the hard decision data (hereafter, referred to as reliability data) in addition to the hard decision data and the error correction codes. The ECC 230 may perform both or any one of hard decision and soft decision on the data received from the memory device 122. When an error is not corrected through hard decision performed on the data received from the memory device 122, the ECC 230 may perform soft decision.

In an embodiment, the ECC 230 may correct an error of the data received from the memory device 122, using coded modulation such as a low density parity check (LDPC) code, Bose, Chaudhri, Hocquenghem (BCH) code, turbo code, Reed-Solomon (RS) code, convolution code, recursive systematic code (RSC), trellis-coded modulation (TCM) or block coded modulation (BCM).

The ECC 230 may correct an error of data received from the memory device 122 based on group parity. Specifically, the ECC 230 may set a data group according to a standard or criterion, and generate group parity for error correction based on data included in the set data group, during a write operation. The group parity may be stored in the memory device 122 with the data group. Furthermore, a read operation for the group parity may be performed at the same time as a read operation for the data group corresponding to the group parity. Alternatively, the read operation for the group parity may be performed before and/or after a read operation for the data group corresponding to the group parity. When an error occurs in data belonging to the data group during the read operation for the data group, the ECC 230 may correct an error of the data group based on the group parity. The standard or criterion may be set based on one among a plurality of regions such as a block, page, or word line. For example, the standard or criterion may be set to a super block including a plurality of blocks where read operations are performed at the same time. Alternatively, the standard or criterion may be set to a page coupled to one or more word lines.

In an embodiment, the ECC 230 may generate the group parity by performing a logical operation (e.g., an XOR operation) on data belonging to the same data group.

In an embodiment, the ECC 230 may perform error correction based on the group parity at the same time as another error correction method (for example, ECC decoding or predicted error parity). Alternatively, the ECC 230 may perform error correction based on the group parity before and/or after another error correction method (for example, ECC decoding or predicted error parity). Furthermore, when error correction through another error correction method is impossible, the ECC 230 may perform error correction based on the group parity.

The host I/F 240 may enable data communication between the memory system 120 and the host 110. Specifically, the host I/F 240 may receive a request such as a write, read or erase request from the host 110, and transfer data corresponding to the received request to the host 110. For this operation, the host 110 may be driven based on firmware referred to as a host interface layer (HIL).

In an embodiment, the host I/F 240 may be implemented with Universal Serial Bus (USB), Multi-Media Card (MMC), Peripheral Component Interconnect Express (PCI-e or PCIe), small computer system interface (SCSI), Serial-attached SCSI (SAS), Serial Advanced Technology Attachment (SATA), Parallel Advanced Technology Attachment (PATA), Enhanced Small Disk Interface (ESDI), Integrated Drive Electronics (IDE), or Mobile Industry Processor Interface (MIPI), according to a communication protocol which defines exchange of data with the host 110.

The memory I/F 250 may enable data communication between the controller 121 and the memory device 122. Specifically, the memory I/F 250 may transfer data to the memory device 122. The data may include data required for processing a request such as a write, read or erase request received from the host 110 and other data required for maintaining the memory system 120. Then, the memory I/F 250 may receive the corresponding data from the memory device 122. For this operation, the memory I/F 250 may be driven through firmware referred to as a flash interface layer (FIL).

The PMU 260 may manage power required for driving the memory system 120. Specifically, the PMU 260 may receive power from a battery or an external device such as the host 110, and distribute the received power to operate the respective units of the memory system 120. Furthermore, the PMU 260 may include a capacitor or battery for storing power to normally operate the memory system 120 even in case of a sudden power-off.

The P-ECC 270 may predict data which is highly likely to cause a read fail during a read operation, and correct the predicted data. The P-ECC 270 will be described below in detail with reference to FIG. 3.

The function performed by the P-ECC 270 may be implemented as a part of the FTL in the form of firmware.

Figure 3:
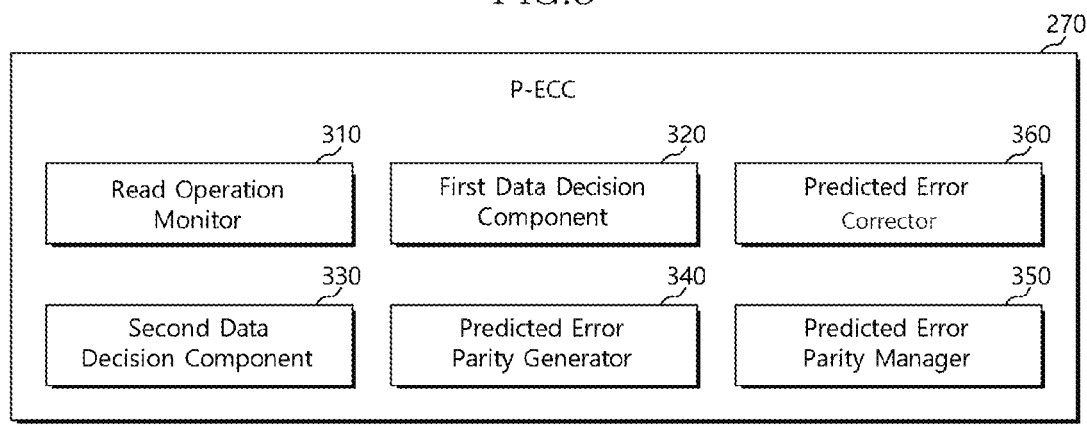
FIG. 3 is a block diagram illustrating a predicted error correction apparatus in accordance with an embodiment.

FIG. 3 is a block diagram illustrating a predicted error correction (P-ECC) apparatus 270 in accordance with an embodiment.

Referring to FIG. 3, the P-ECC 270 may predict an occurrence of error and correct the predicted error. For this operation, the P-ECC 270 may include a read operation monitor 310, a first data decision component 320, a second data decision component 330, a predicted error parity generator 340, a predicted error parity manager 350 and a predicted error corrector 360.

The read operation monitor 310 may monitor a read operation of the memory system 120. Specifically, the read operation monitor 310 may monitor fail bits, i.e., bits that are not correctly read, whether soft decision is performed, and whether error correction is performed, during a read operation for data stored in the memory device 122. Furthermore, the read operation monitor 310 may detect an occurrence of error during a read operation, or receive an error detection result from the ECC 230 of FIG. 2.

In an embodiment, the read operation monitor 310 may monitor the number of accesses to data stored in the memory device 122, i.e., the number of erase, read and write operations.

The first data decision component 320 may decide data with low stability. Specifically, the first data decision component 320 may determine or identify data with low stability, i.e., first data, which is highly likely to cause a read fail during a subsequent read operation based on the monitoring result of the read operation monitor 310.

In an embodiment, the first data decision component 320 may determine the first data based on fail bits. For example, when the number of fail bits is greater than or equal to a first threshold value (for example, 2), the first data decision component 320 may select the corresponding data as the first data. The first threshold value may be determined according to the error correction ability of the ECC 230. The first threshold value may be arbitrarily set at the fabrication or use step of the memory system 120.

In an embodiment, the first data decision component 320 may determine the first data based on whether soft decision has been performed. For example, during a read operation for the data stored in the memory device 122, the first data decision component 320 may select data on which soft decision has been performed, as the first data.

In an embodiment, the first data decision component 320 may determine the first data based on fail bits and whether soft decision has been performed. For example, the first data decision component 320 may select data containing fail bits the number of which is greater than or equal to a set number of fail bits, among data on which soft decision has been performed, as the first data.

The second data decision component 330 may determine the second data which is used to generate the predicted error parity. Specifically, the second data decision component 330 may determine one or more second data which are used to generate the predicted error parity which is used for correcting a predicted error during a s read operation for data stored in the memory device 122, that is, an error of the first data, when the predicted error occurs.

The second data decision component 330 may determine the second data based on stability. Specifically, the second data decision component 330 may select data with high stability as the second data, based on the monitoring result of the read operation monitor 310. This is in order to improve the performance of the predicted error correction by generating the predicted error parity based on data with relatively high stability.

In an embodiment, the second data decision component 330 may determine the second data by determining stability based on fail bits. For example, the second data decision component 330 may select data as the second data. The data may contain no fail bits or fail bits the number of which is less than or equal to a second threshold value (for example, 1) during a read operation.

In an embodiment, the second data decision component 330 may determine the second data by determining stability based on whether soft decision has been performed. For example, the second data decision component 330 may select data on which soft decision is not performed during the read operation, as the second data.

In an embodiment, the second data decision component 330 may determine the second data by determining stability based on an access number. For example, the second data decision component 330 may select data as the second data. The data may be stored in a block, page or cell of which the read, write or erase number is greater than or equal to a third threshold value (for example, 100).

In an embodiment, the second data decision component 330 may determine the second data by determining stability based on two or more of the fall bits, whether soft decision has been performed, and the access number.

The second data decision component 330 may determine the second data based on locality. This is in order to reduce a time delay which occurs during a process of reading data stored in the memory device 122 in order to correct an error of the first data.

In an embodiment, the second data decision component 330 may determine the second data based on spatial locality. For example, the second data decision component 330 may select data as the second data. The data may have an address adjacent to the logical address or physical address of the first data. That is, the second data decision component 330 may select data which is read at the same time as or before and/or after the first data during the read operation, as the second data.

In an embodiment, the second data decision component 330 may determine the second data based on temporary locality. For example, the second data decision component 330 may select data with a high frequency of read operations among the data stored in the memory device 122, as the second data.

In an embodiment, the second data decision component 330 may determine the second data based on spatial locality and temporary locality.

Furthermore, the second data decision component 330 may determine the second data based on stability and locality.

The second data decision component 330 may determine the second data based on the efficiency of predicted error correction. For example, when separate means (for example, group parity) for correcting an error of the first data are present, the second data decision component 330 may determine the number of second data, such that the size of the second data is less than the size of data constituting a data group. That is, when a data group including the first data is composed of four pages, the second data decision component 330 may determine the number of second data such that a data group including the second data is composed of three or less pages. That is, the second data decision component 330 may determine the number of second data, such that a computation amount required for correcting an error of data based on the predicted error parity is smaller than a computation amount required by another error correction method.

The second data decision component 330 may determine a part or all of the second data among the data stored in the memory device 122. When only a part of the second data is determined among the data stored in the memory device 122, the second data decision component 330 may select data stored in the memory 220 or set data for generating the predicted error parity as the second data.

The second data decision component 330 may determine a part or all of the second data in consideration of a separate error corrector. For example, the second data decision component 330 may determine a part or all of the second data among the data group to which the first data belongs, when group parity for the first data is present.

The predicted error parity generator 340 may generate predicted error parity for correcting a predicted error. Specifically, when the first and second data are determined, the predicted error parity generator 340 may generate the predicted error parity based on the determined first and second data. The predicted error parity may be used to correct an error which occurred not only in the first data, but also in the second data.

In an embodiment, the predicted error parity generator 340 may generate the predicted error parity by performing a logical operation (e.g., an XOR operation) on the first and second data.

The predicted error parity manager 350 may manage the predicted error parity. Specifically, the predicted error parity manager 350 may store one or more of the index of the first data, the index of the second data and the predicted error parity in the memory device 122 or a separate storage space such as a memory. The index of the first or second data may include a logical address, a physical address, and a page number.

The predicted error corrector 360 may correct the predicted error. Specifically, when a fail bit occurs during a read operation for data stored in the memory device 122, the predicted error corrector 360 may check whether there is predicted error parity corresponding to data containing the fail bit, based on the index of the first or second data managed by the predicted error parity manager 350. When there is the predicted error parity corresponding to the data containing the fail bit, the predicted error corrector 360 may correct an error of the data containing the fail bit, based on the first or second data and the predicted error parity.

In an embodiment, the predicted error corrector 360 may be operated with priority over other error correction components. Also, when an error is not corrected by the ECC 230 of FIG. 2, the predicted error corrector 360 may correct the error based on the predicted error parity. Furthermore, the predicted error corrector 360 may correct an error based on the predicted error parity, with precedence over the ECC 230.

Furthermore, the descriptions of the P-ECC apparatus 270 may be extended to the controller 121, the FTL, the error management command, the memory system 120 and the like.

Figure 4:
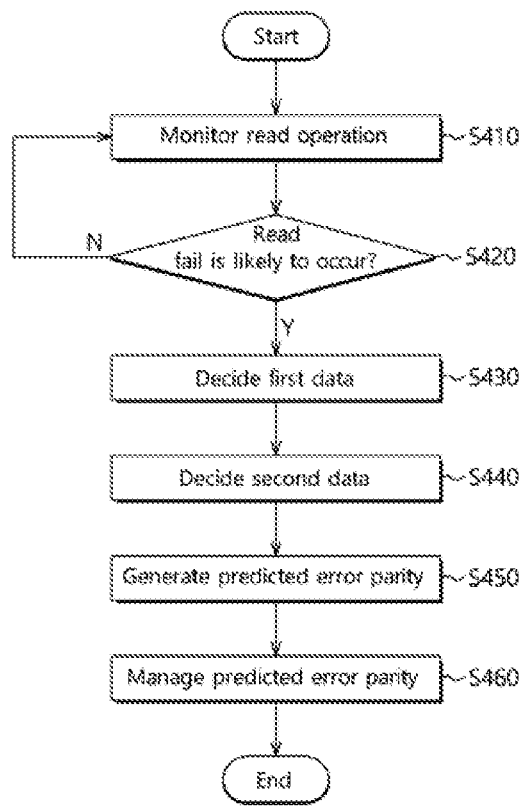
FIG. 4 is a flowchart illustrating a predicted error generation method in accordance with an embodiment.

FIG. 4 is a flowchart illustrating a predicted error generation method in accordance with an embodiment.

The method of FIG. 4 may be performed by the P-ECC apparatus 270, the controller 121, the FTL, and/or the memory system 120. However, the following description is provided in the context that the method is performed by the controller 121.

Referring to FIG. 4, a read operation may be monitored at step S410. Specifically, the controller 121 may monitor fail bits, whether soft decision is performed, and whether error correction is performed, during a read operation for data stored in the memory device 122.

In an embodiment, the controller 121 may monitor the number of accesses to the data stored in the memory device 122, i.e., the number of erase, read or write operations.

At step S420, the controller 121 may determine whether a read fail is likely to occur. Specifically, the controller 121 may determine whether a read fail is likely to occur during a subsequent read operation, based on fail bits and whether soft decision has been performed. When it is determined that a read fail is unlikely to occur (S420, N), the controller 121 may perform step S410 again. When it is determined that a read fail is likely to occur (S420, Y), the controller 121 may perform step S430.

At step S430, the controller 121 may determine the first data. Specifically, the controller 121 may select data which is highly likely to cause a read fail, as the first data.

In an embodiment, the controller 121 may determine the first data based on fail bits. For example, when there occur fail bits of which the number is greater than or equal to the first threshold value (for example, 2), the controller 121 may select the corresponding data as the first data. The first threshold value may be determined according to the ability correction ability of the ECC 230. Furthermore, the first threshold value may be arbitrarily set at the fabrication or use step of the memory system 120.

In an embodiment, the controller 121 may determine the first data based on whether soft decision has been performed. For example, during a read operation for data stored in the memory device 122, the controller 121 may select data on which soft decision has been performed, as the first data.

In an embodiment, the controller 121 may determine the first data based on the fail bits and whether soft decision has been performed. For example, the controller 121 may select data containing fails bits of which the number is greater than or equal to a set number of fail bits, among data on which soft decision has been performed, as the first data.

At step S440, the controller 121 may determine the second data. Specifically, the controller 121 may determine one or more second data which are used to generate predicted error parity used for correcting a predicted error, i.e., an error of the first data, during a read operation for data stored in the memory device 122.

The controller 121 may determine the second data based on stability. Specifically, the controller 121 may select data with high stability as the second data based on the monitoring result of the read operation monitor 310. This is done in order to improve the performance of the predicted error correction by generating the predicted error parity based on data with relatively high stability.

In an embodiment, the controller 121 may determine the second data by determining stability based on the fail bits. For example, the controller 121 may select data as the second data, the data containing no fail bits or fail bits of which the number is less than or equal to a second threshold value (for example, 1), during a read operation.

In an embodiment, the controller 121 may determine the second data by determining stability based on whether soft decision has been performed. For example, the controller 121 may select data on which soft decision is not performed during a read operation, as the second data.

In an embodiment, the controller 121 may determine the second data by determining stability based on the access number. For example, the controller 121 may select data as the second data. The selected data may be stored in a block, page or cell of which the read, write or erase number is greater than or equal to a third threshold value (for example, 100).

In an embodiment, the controller 121 may determine the second data by determining stability based on two or more of the fail bits, whether soft decision has been performed, and the access number.

The controller 121 may determine the second data based on locality. This is done in order to reduce a time delay which occurs during a process of reading data stored in the memory device 122 in order to correct an error of the first data.

In an embodiment, the controller 121 may determine the second data based on spatial locality. For example, the controller 121 may select data as the second data. The selected data may have an address adjacent to the logical address or physical address of the first data. That is, the controller 121 may select data which is read at the same time as or before and/or after the first data during the read operation, as the second data.

In an embodiment, the controller 121 may determine the second data based on temporary locality. For example, the controller 121 may select data with a high frequency of read operations among the data stored in the memory device 122, as the second data.

In an embodiment, the controller 121 may determine the second data based on spatial locality and temporary locality.

In an embodiment, the controller 121 may determine the second data based on stability and/or locality.

The controller 121 may determine the number of second data based on the efficiency of predicted error correction. For example, when separate means (for example, group parity) for correcting an error of the first data are present, the controller 121 may determine the number of second data such that the size of the second data is less than the size of data constituting a data group. That is, when a data group including the first data is composed of four pages, the controller 121 may determine the number of second data such that a data group including the second data is composed of three or less pages.

The controller 121 may determine a part or all of the second data among the data stored in the memory device 122. When only a part of the second data is determined among the data stored in the memory device 122, the controller 121 may select data stored in the memory or set data for generating the predicted error parity as the second data.

The controller 121 may determine a part or all of the second data in consideration of a separate error corrector. For example, the second data decision component 330 may determine a part or all of the second data in the data group to which the first data belongs, when group parity for the first data is present.

At step S450, the controller 121 may generate the predicted error parity. Specifically, when the first and second data are determined, the controller 121 may generate the predicted error parity based on the determined first and second data. The predicted error parity may be used to correct an error which occurred not only in the first data, but also in the second data.

In an embodiment, the controller 121 may generate the predicted error parity by performing a logical operation, e.g., an XOR operation, on the first and second data.

At step S460, the controller 121 may manage the predicted error parity. Specifically, the controller 121 may store one or more of the index of the first data, the index of the second data and the predicted error parity in the memory device 122 or a separate storage space such as a memory. The index of the first or second data may include an address, and page number.

Figure 5:
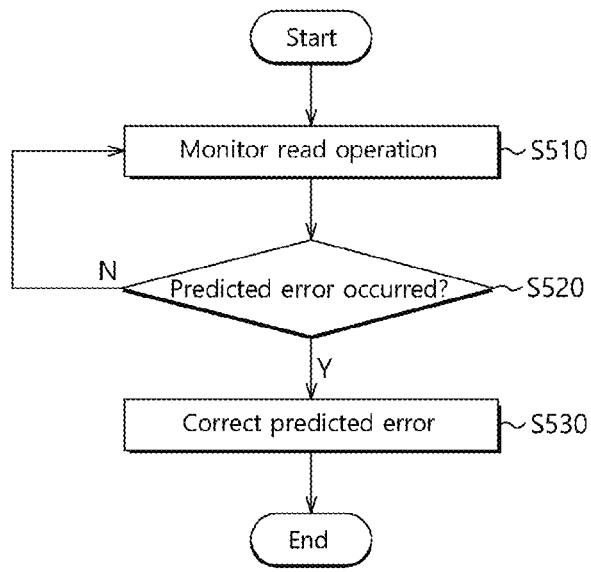
FIG. 5 is a flowchart illustrating a predicted error correction method in accordance with an embodiment.

FIG. 5 is a flowchart illustrating a predicted error correction method in accordance with an embodiment.

The method of FIG. 5 may be performed by the P-ECC apparatus 270, and/or the controller 121. However, the following description is provided in the context that the method is performed by the controller 121.

At step S510, the controller 121 may monitor a read operation. Specifically, the controller 121 may check whether an error such as a fall bit occurs, by monitoring a read operation for data stored in the memory device 122.

At step S520, the controller 121 may check whether a predicted error occurred. Specifically, the controller 121 may check whether data containing an error is the first data, based on the index of the first data, during the read operation. When the check result indicates that the data containing the error is the first data, the controller 121 may determine that the predicted error occurred. When it is determined that no error occurred (S520, N), the controller 121 may perform step S510 again. When it is determined that the error occurred (S520, Y), the controller 121 may perform step S530.

At step S530, the controller 121 may correct the predicted error. Specifically, the controller 121 may correct the first data containing the error, based on the second data and the predicted error parity.

Figure 6:
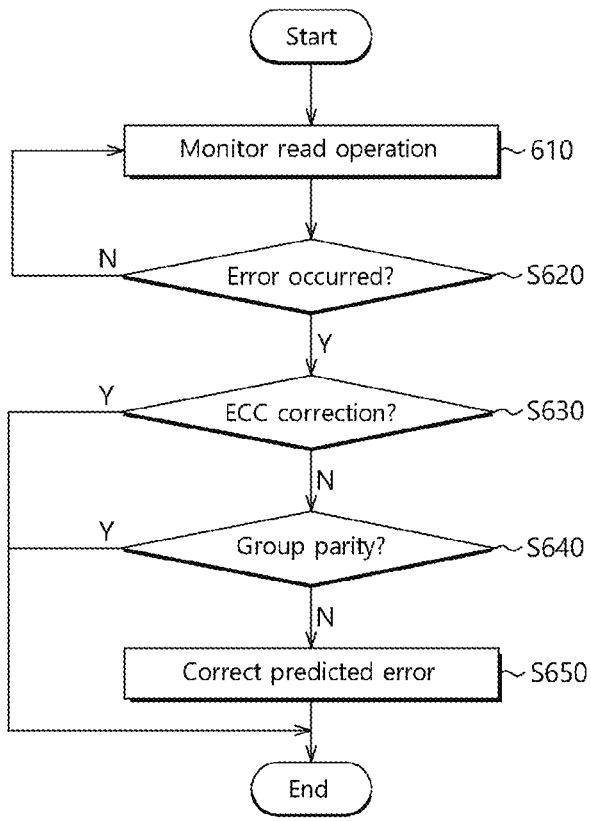
FIG. 6 is a flowchart illustrating a predicted error correction method in accordance with another embodiment.

FIG. 6 is a flowchart illustrating a predicted error correction method in accordance with another embodiment.

The method of FIG. 6 may be performed by the P-ECC apparatus 270, and/or the controller 121. However, the following description is provided in the context that the method is performed by the controller 121.

At step S610, the controller 121 may monitor a read operation. Specifically, the controller 121 may monitor the read operation for data stored in the memory device, and check whether an error such as a fail bit occurred.

At step S620, the controller 121 may check whether an error occurred. Specifically, the controller 121 may check whether an error occurred during the read operation for the data stored in the memory device 122, through ECC decoding. When the check indicates that no error occurred (S620, N), the controller 121 may perform step S610 again. When it is determined that the error occurred (S620, Y), the controller 121 may perform step S630.

At step S630, the controller 121 may perform ECC correction. For example, when an error of the data is determined to have occurred, the controller 121 may correct the error by performing ECC decoding.

At step S640, the controller 121 may perform error correction based on group parity. Specifically, when the error identified during the read operation is not corrected through ECC decoding, the controller 121 may check whether there is group parity corresponding to the data containing the error. When such group parity is determined to exist (S640, Y), the controller 121 may correct the data containing the error, based on the group parity and the data constituting the corresponding data group. When it is determined that there is no group parity (S640, N), the controller 121 may perform step S650.

At step S650, the controller 121 may perform error correction based on the predicted error parity. Specifically, when the error identified during the read operation cannot be corrected through ECC decoding and the group parity, the controller 121 may check whether the data containing the error corresponds to the first data. When the check result indicates that the data containing the error corresponds to the first data, the controller 121 may correct the data containing the error, based on the second data and the predicted to error parity.

Referring back to FIG. 1, the memory device 122 may include a plurality of memory blocks, e.g., memory blocks 120a, 120b and 120c, each of which may include a plurality of pages. Each of the pages may include a plurality of memory cells to which a plurality of word lines are coupled. Furthermore, the memory device 122 may include a plurality of planes, each having a plurality of memory blocks. Still further, the memory device 122 may include a plurality of memory dies each having a plurality of planes. In an embodiment, the memory device 122 may be implemented with a nonvolatile memory device such as a flash memory. The flash memory may have a three-dimensional stack structure. An exemplary configuration of the memory device 122 will be described in detail with reference to FIGS. 7 to 9.

Figure 7:
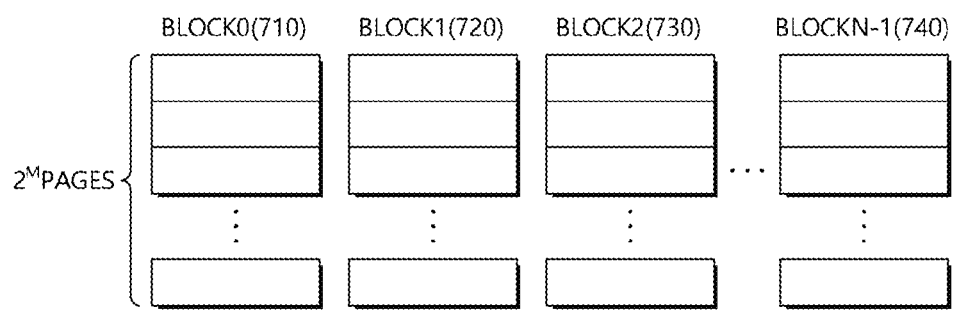
FIG. 7 schematically illustrates a memory device in accordance with an embodiment.

FIG. 7 schematically illustrates a memory device 122 in accordance with an embodiment.

Referring to FIG. 7, the memory device 122 may include a plurality of memory blocks, for example, a block BLOCK0 710, a block BLOCK1 720, a block BLOCK2 730 and a block BLOCKN−1 740. Each of the blocks 710 to 740 may include a plurality of pages, for example, $2^M$ pages. By way of example, in the present embodiment each of the memory blocks includes $2^M$ pages. However, each of the memory blocks may include a different number of pages, e.g., M pages. Each of the pages may include a plurality of memory cells to which a plurality of word lines WL are coupled.

The memory device 122 may include a plurality of memory blocks which may be single level cell (SLC) memory blocks and/or multi-level cell (MLC) memory blocks, depending on the number of bits which can be expressed or stored in one memory cell. The SLC memory block may include a plurality of pages implemented by memory cells each configured to store 1 bit of data therein, and have quick data operation performance and high durability. The MLC memory block may include a plurality of pages implemented by memory cells each configured to store multi-bit data (for example, 2 or more bits of data) therein, and have a larger data storage space, i.e., higher integration density than the SLC memory block. Particularly, an MLC memory block may further include a triple level cell (TLC) memory block, a quadruple level cell (QLC) memory block and a multiple-level-cell memory block. The TLC memory block may include a plurality of pages implemented by memory cells each configured to store 3 bits of data therein. The QLC memory block may include a plurality of pages implemented by memory cells each configured to store 4 bits of data therein. The multiple-level-cell memory block may also include a plurality of pages implemented by memory cells each configured to store 5 or more bits of data therein.

Each of the blocks 710 to 740 may store data provided from the host 110 of FIG. 1 through a write operation, and provide data stored therein to the host 110 through a read operation.

Figure 8:
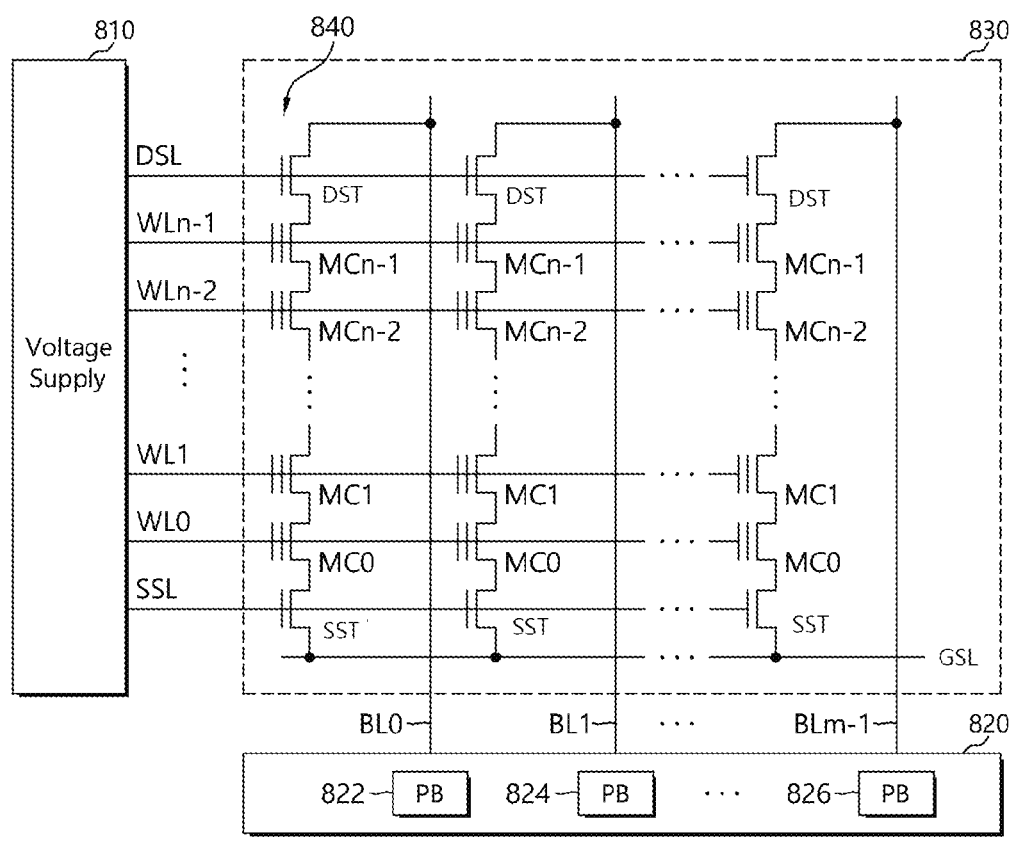
FIG. 8 schematically illustrates a cell array circuit of a memory device in accordance with the present embodiment.

FIG. 8 schematically illustrates a cell array circuit of a memory device 122 in accordance with the present embodiment.

Referring to FIG. 8, each memory block 830 of the plurality of memory blocks 120a, 120b and 120c included in the memory device 122 of the memory system 120 may include a plurality of cell strings 840 implemented as a memory cell array and coupled to bit lines BL0 to BLm−1, respectively. The cell string 840 in each column may include one or more drain select transistors DST and one or more source select transistors SST. Between the select transistors DST and SST, a plurality of memory cells or memory cell transistors MC0 to MCn−1 may be coupled in series. Each of the memory cells MC0 to MCn−1 may be configured as a multi-level cell (MLC) for storing multi-bit data information therein. The cell strings 840 may be electrically coupled to the corresponding bit lines BL0 to BLm−1, respectively.

FIG. 8 illustrates the memory block 830 constituted by NAND flash memory cells. However, the plurality of memory blocks 120a, 120b and 120c included in the memory device 122 may not be limited to only a NAND flash memory, but implemented as a NOR-type flash memory, a hybrid flash memory in which two or more types of memory cells are combined, or a one-NAND flash memory having a controller embedded in a memory chip. Furthermore, the memory device 122 may be implemented as a flash memory device having a charge storage layer configured as a conductive floating gate or a charge trap flash (CTF) memory device having a charge storage layer formed of an insulating film.

The memory device 122 may include a voltage supply 810 configured to provide word line voltages which are to be supplied to the respective word lines (for example, a write voltage, read voltage, and pass voltage) and a voltage which is to be supplied to a bulk (for example, well area) in which the memory cells are formed, depending on an operation mode. A voltage generation operation of the voltage supply 810 may be performed under control of a control circuit (not illustrated). The voltage supply 810 may generate a plurality of variable read voltages to generate a plurality of read data, select one of the memory blocks (or sectors) of the memory cell array in response to control of the control circuit, select one of the word lines of the selected memory block, and provide the word line voltages to the selected word line and unselected word lines.

The memory device 122 may include a read and write (read/write) circuit 820 which is controlled by the control circuit and operated as a sense amplifier or write driver depending on an operation mode. For example, in case of a verify and/or normal read operation, the read/write circuit 820 may be operated as a sense amplifier for reading data from the memory cell array. Furthermore, in case of a write operation, the read/write circuit 820 may be operated as a write driver to drive bit lines according to data to be stored in the memory cell array. The read/write circuit 820 may receive data to be stored in the memory cell array from a buffer (not illustrated) and drive bit lines according to the received data, during the write operation. For this operation, the read/write circuit 820 may include a plurality of page buffers (PB) 822, 824 and 826 corresponding to columns (or bit lines) or column pairs (bit lines pairs), respectively. Each of the page buffers 822, 824 and 826 may include a plurality of latches (not illustrated).

Figure 9:
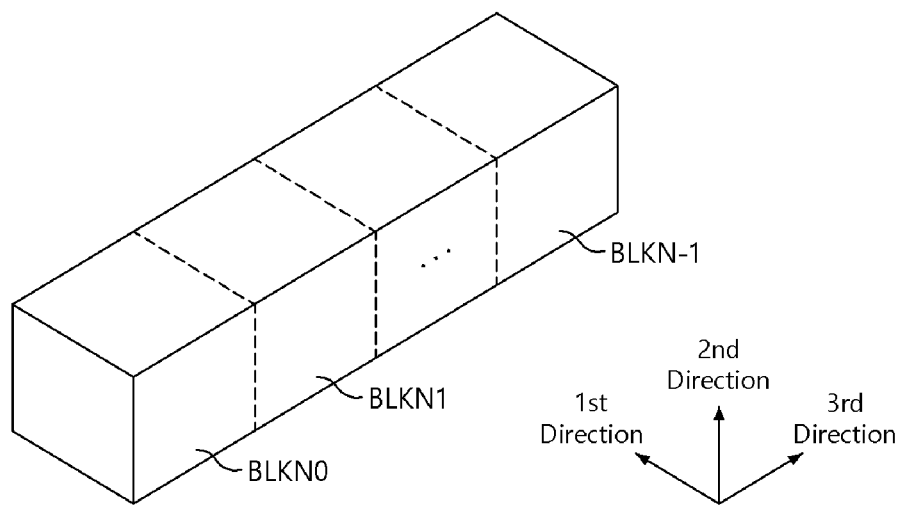
FIG. 9 is a diagram illustrating an example of a three-dimensional (3D) stack structure of a memory device in accordance with the present embodiment.

FIG. 9 is a diagram illustrating a memory device 122 having a three-dimensional (3D) stack structure in accordance with an embodiment.

The memory device 122 may be implemented as a two-dimensional (2D) or 3D memory device, an example of the latter being illustrated in FIG. 9. In particular, as illustrated in FIG. 9, the memory device 122 may be implemented as a nonvolatile memory device having a 3D stack structure. The memory device 122 may include a plurality of memory blocks BLK0 to BLKN−1 having a 3D stack structure. FIG. 9 is a block diagram showing the memory blocks 120a, 120b and 120c of the memory device 122 illustrated in FIG. 1, and each of the memory blocks 120a, 120b and 120c may have a 3D s structure or vertical structure. For example, each of the memory blocks 120a, 120b and 120c may be a 3D structure with dimensions extending in mutually orthogonal directions, for example, the x-axis, y-axis and z-axis directions shown in FIG. 9.

Referring back to FIG. 8, each of the memory blocks 830 included in the memory device 122 may include a plurality of NAND strings NS extended in the second direction, and a plurality of NAND strings NS may also be provided in the first and third directions. Each of the NAND strings NS may be coupled to a bit line BL, one or more string select lines SSL, one or more ground select lines GSL, a plurality of word lines WL, one or more dummy word lines DWL, and a common source line CSL, and include a plurality of transistor structures TS.

That is, each memory block 830 of the plurality of memory blocks 120a, 120b and 120c of the memory device 122 may be coupled to a plurality of bit lines BL, a plurality of string select lines SSL, a plurality of ground select lines GSL, a plurality of word lines WL, a plurality of dummy word lines DWL and a plurality of common source lines CSL, and thus include the plurality of NAND strings NS. In each of the memory blocks 830, the plurality of NAND strings NS may be coupled to one bit line BL, and a plurality of transistors may be implemented in one NAND string NS. Furthermore, the string select transistor SST of each NAND string NS may be coupled to the corresponding bit line BL, and the ground select transistor GST of each NAND string NS may be coupled to the common source line CSL. Here, memory cells MC may be provided between the drain select transistor DST and the source select transistor SST of each NAND string NS. That is, a plurality of memory cells may be implemented in each memory block 830 of the plurality of memory blocks 120a, 120b and 120c of the memory device 122.

In accordance with embodiments, the reliability of data and the efficiency of the error correction may be improved.

While various embodiments have been illustrated and described, it will be understood by those skilled in the art in light of the present disclosure that the embodiments disclosed are examples only. Accordingly, the present invention is not limited based on the described embodiments. Rather, the present invention encompasses all variations and modifications that fall within the scope of the claims.

What is claimed is:

1. A memory system comprising:
a memory device configured to perform one or more of data write, read and erase operations; and
a controller configured to execute an error management command and control the operation of the memory device,
wherein the error management command is configured to determine first data which is highly likely to cause a read fail, among data stored in the memory device, determine one or more second data which is used to generate predicted error parity, and generate the predicted error parity based on the determined first and second data,
wherein the memory device performs the write operation to store indexes of the first and second data and the predicted error parity under control of the controller,
wherein the error management command determines the second data based on one or more of stability and locality of data, and wherein the error management command determines the second data by determining the stability based on one or more of an erase number, whether soft decision has been performed and a fail bit.

2. The memory system according to claim 1, wherein the error management command determines the first data by determining whether the read fail is likely to occur based on one or more of a fail bit and whether soft decision has been performed.

3. The memory system according to claim 1, wherein the error management command determines the second data by determining the locality based on one or more of temporary locality and spatial locality for the first data.

4. The memory system according to claim 1, wherein, when a fail bit occurs in any one of the first and second data, the error management command corrects data containing the fail bit based on the predicted error parity.

5. The memory system according to claim 4, wherein the error management command corrects the data containing the fail bit based on the predicted error parity, when the data containing the fail bit is not corrected through an error correction code (ECC) decoding process.

6. The memory system according to claim 1, wherein the error management command determines all or part of the second data among the data stored in the memory device.

7. The memory system according to claim 1, wherein, when group parity indicating parity of a data group is present and the first data is included in the data group, the error management command determines the number of second data such that the size of the second data is less than the size of data constituting the data group, wherein the data group includes all or part of the data stored in the memory device according to a standard.

8. A non-transitory machine-readable storage medium which stores executable instructions that causes a processor of a controller in a memory system to execute a predicted error correction method, the method comprising:
determining by a first data decision component, first data which is highly likely to cause a read fail, among data stored in a memory device;
determining by a second data decision component, one or more second data which are used to generate predicted error parity as parity corresponding to the first data, based on one or more of stability and locality of data; and
generating by a predicted error parity generator, the predicted error parity based on the first and second data
wherein the second data decision component determines the second data by determining the stability based on one or more of an erase number, whether soft decision has been performed, and a fail bit.

9. The non-transitory machine-readable storage medium according to claim 8, wherein the first data decision component determines the first data by determining whether the read fail is likely to occur, based on one or more of a fail bit and whether soft decision has been performed.

10. The non-transitory machine-readable storage medium according to claim 8, wherein the second data decision component determines the second data by determining the locality based on one or more of temporary locality and spatial locality for the first data.

11. The non-transitory machine-readable storage medium according to claim 8, wherein the method further comprises managing, by a predicted error parity manager, indexes of the first and second data and the predicted error parity.

12. The non-transitory machine-readable storage medium according to claim 8, wherein the method further comprises correcting, by a predicted error corrector, data containing a fail bit based on the predicted error parity, when the fail bit occurs in any one of the first and second data during a read operation.

13. The non-transitory machine-readable storage medium according to claim 12, wherein the predicted error corrector corrects the data containing the fail bit based on the predicted error parity, when the data containing the fail bit is not corrected through an error correction code (ECC) decoding process.

14. The non-transitory machine-readable storage medium according to claim 8, wherein the second data decision component determines all or part of the second data among the data stored in the memory device.

15. The non-transitory machine-readable storage medium according to claim 8, wherein, when group parity indicating parity of a data group is present and the first data is included in the data group, the second data decision component determines the number of second data such that the size of the second data is less than the size of data constituting the data group, wherein the data group includes all or part of the data stored in the memory device according to a standard.

16. A memory system comprising:
a memory device suitable for storing a plurality of data; and
a controller suitable for:
determining first data and second data, the first data including data of which the number of fail bits is greater than a threshold value, the second data including at least one data among the plurality of data excluding the first data;
generating parity data based on the first data and the second data;
controlling the memory device to perform a read operation; and when it is determined that an error occurred on the first data as the result of the read operation, correcting the first data based on the parity data,
wherein the controller determines the second data based on one or more of stability and locality of data, and
wherein the controller determines the second data by determining the stability based on one or more of an erase number, whether soft decision has been performed and a fail bit.

* * * * *